(12) United States Patent
Lyons et al.

(10) Patent No.: US 12,001,137 B2
(45) Date of Patent: Jun. 4, 2024

(54) SYSTEM AND METHOD FOR CONTROLLING THE PLACEMENT OF FLUID RESIST DROPLETS

(71) Applicant: CANON KABUSHIKI KAISHA, Tokyo (JP)

(72) Inventors: Colleen Lyons, Austin, TX (US); Whitney Longsine, Austin, TX (US); Matthew C. Traub, Austin, TX (US); Van Nguyen Truskett, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/875,632

(22) Filed: Jul. 28, 2022

(65) Prior Publication Data

US 2022/0365426 A1 Nov. 17, 2022

Related U.S. Application Data

(62) Division of application No. 15/711,400, filed on Sep. 21, 2017, now Pat. No. 11,448,958.

(51) Int. Cl.
*G03F 7/00* (2006.01)
*G03F 7/16* (2006.01)

(52) U.S. Cl.
CPC .............. *G03F 7/0002* (2013.01); *G03F 7/16* (2013.01)

(58) Field of Classification Search
CPC .................................................. G03F 7/0002

(Continued)

(56) References Cited

U.S. PATENT DOCUMENTS 5,992,968 A * 11/1999 Uetsuki ................ B41J 2/04581
 347/47
2005/0025880 A1* 2/2005 Masuda ................. B82Y 30/00
 427/256

(Continued)

FOREIGN PATENT DOCUMENTS

JP 2002210981 A * 7/2002 ................ B41J 2/03
JP 2002225280 A * 8/2002 ................ B41J 2/03

OTHER PUBLICATIONS

Studylib Math/Statistics and Probability/Statistics: Empirical Rule (3 Sigma Rule): https://studylib.net/doc/9615599/empirical-rule--3—sigma-rule—Wayback Machine from Feb. 12, 2016 (Year: 2016).*

(Continued)

*Primary Examiner* — Jacob T Minskey
*Assistant Examiner* — Wayne K. Swier
(74) *Attorney, Agent, or Firm* — Daniel Ratoff

(57) ABSTRACT

A fluid dispensing system, an imprint lithography system with a fluid dispensing system, a method of manufacturing an article with the fluid dispensing system. The fluid dispensing system comprising: a fluid dispenser and a heater. The fluid dispenser configured to dispense droplets of a fluid onto a substrate. The heater configured to maintain droplet temperature at greater than 23° C. Each of the droplets has a fluid volume that is less than 1.2 pL. The fluid dispenser is configured to have a drop placement accuracy for the imprint resist fluid that is less than a first threshold when the droplet fluid temperature is greater than 23° C. The drop placement accuracy is greater than the first threshold when the droplet fluid temperature is less than or equal to 23° C.

17 Claims, 7 Drawing Sheets

(58) Field of Classification Search
USPC .......................................................... 438/759
See application file for complete search history.

(56) References Cited

U.S. PATENT DOCUMENTS

| | | | |
|---|---|---|---|
| 2012/0229548 A1* | 9/2012 | Ito ............................ | B41J 29/38 |
| | | | 347/14 |
| 2015/0099059 A1* | 4/2015 | Harjee .................. | B41J 2/04593 |
| | | | 427/8 |
| 2017/0106399 A1* | 4/2017 | Sreenivasan ............... | B41J 2/01 |

OTHER PUBLICATIONS

Machine translation JP2002210981A (Year: 2002).*
Machine translation JP2002225280A (Year: 2002).*

* cited by examiner

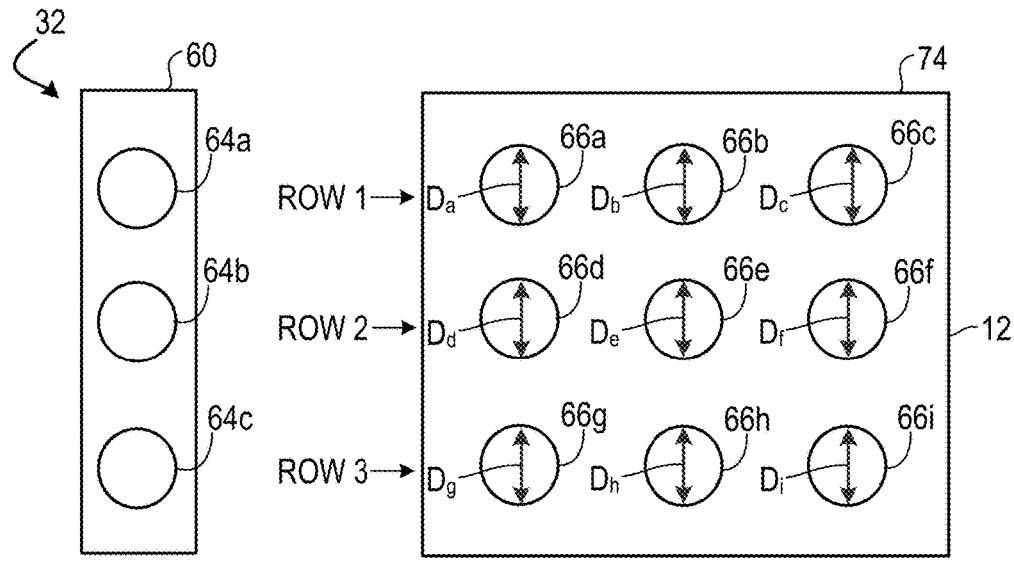
FIG. 6
| TARGET 5.0pL (Vt) | Initial Voltage (Vi) | Average droplet diameter $D_{AVG}$ | Adjust Voltage |
|---|---|---|---|
| Row 1 | 21.7 | 281.1µm | - |
| Row 2 | 21.7 | 272.9µm | Increase voltage |
| Row 3 | 21.7 | 331.0µm | Decrease voltage |
FIG. 7
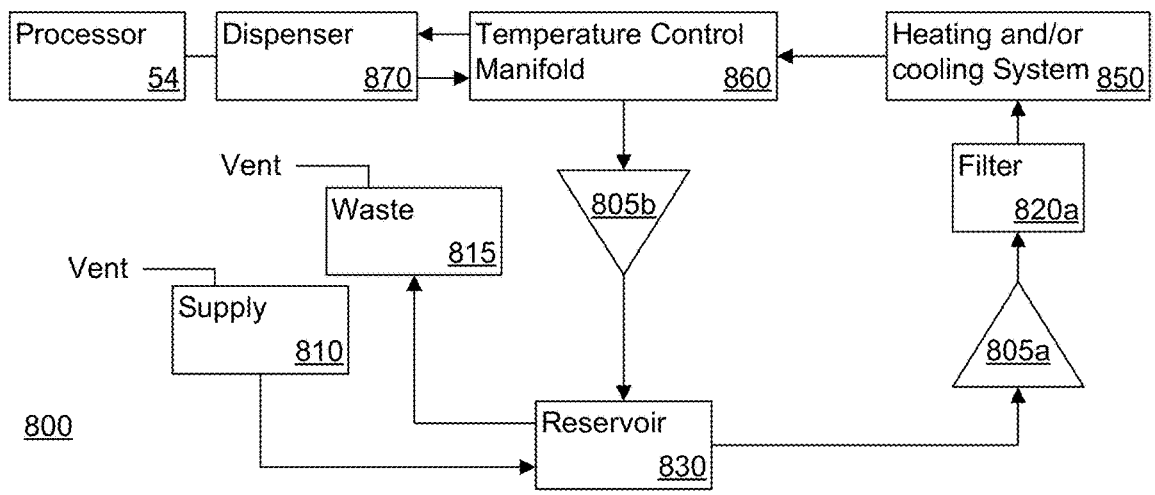
FIG. 8A

SYSTEM AND METHOD FOR CONTROLLING THE PLACEMENT OF FLUID RESIST DROPLETS

CROSS-REFERENCE TO RELATED APPLICATION

This application is a divisional of U.S. patent application Ser. No. 15/711,400 filed on Sep. 21, 2017, the content of which is incorporated herein by reference in its entirety.

BACKGROUND

Field of Art

The present disclosure relates to systems and methods for dispensing small droplets of resist in a controlled manner onto a substrate.

Description of the Related Art

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate; therefore nano-fabrication becomes increasingly important. Nano-fabrication provides greater process control while allowing continued reduction of the minimum feature dimensions of the structures formed.

An exemplary nano-fabrication technique in use today is commonly referred to as nanoimprint lithography. Nanoimprint lithography is useful in a variety of applications including, for example, fabricating layers of integrated devices such as CMOS logic, microprocessors, NAND Flash memory, NOR Flash memory, DRAM memory, MRAM, 3D cross-point memory, Re-RAM, Fe-RAM, STT-RAM, and the like. Exemplary nanoimprint lithography processes are described in detail in numerous publications, such as U.S. Pat. Nos. 8,349,241, 8,066,930, and 6,936,194, all of which are hereby incorporated by reference herein.

A nanoimprint lithography technique disclosed in each of the aforementioned U.S. patents includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a solid layer that has a pattern conforming to a shape of the surface of the template that contacts the formable liquid. After solidification, the template is separated from the rigid layer such that the template and the substrate are spaced apart. The substrate and the solidified layer are then subjected to additional processes, such as etching processes, to transfer a relief image into the substrate that corresponds to the pattern in the solidified layer. The patterned substrate can be further subjected to known steps and processes for device fabrication, including, for example, oxidation, film formation, deposition, doping, planarization, etching, resist removal, dicing, bonding, and packaging, and the like.

A step in the process of nanoimprint lithography may include dispensing a series of small droplets of the formable liquid onto the substrate, such as the ink jet printers disclosed in the following patents.

U.S. Pat. No. 4,352,114 issued to Hiroshi KYOGOKU et al. (hereinafter Kyogoku) discloses an ink jet printer with temperature compensation. The ink jet printer has an electrostriction element that effects a change in the capacity of an ink chamber of the printer. Over a wide ambient temperature range of 0° C. to 40° C. the viscosity of the ink changes which can hinder the normal emission of the ink by the printer. Kyogoku discloses adjusting the voltage of the electrostriction to compensate for this temperature changes so as to achieve a constant ink emission over a wide temperature range.

U.S. Pat. No. 6,293,644 discloses heating ink in an ink jet printer to reduce the effect of satellites produced by the printer. U.S. Pat. No. 7,416,764 discloses a printer with a temperature controlled piezo printhead and lowering the viscosity by increasing the temperature.

After the series of droplets are dispensed the relief pattern from a mold is impressed into the series of droplets which are then solidified. Factors that limit the capabilities of the nanoimprint lithography are the size of the droplets, the positioning accuracy of the droplets, satellite droplets, etc. For a given fluid and dispensing parameters, the positioning accuracy decreases as droplet volume decreases. As the droplets reach below 1 picoliter (pL) the positioning accuracy decreases significantly. What is needed is a method that reduces the volume of the droplets while keeping the positioning accuracy within reasonable limits.

SUMMARY

The present disclosure is of systems and methods for improving the positioning accuracy for small droplets.

At least a first embodiment, may be a fluid dispensing system comprising: a fluid dispenser and a heater. The fluid dispenser may be configured to dispense a plurality of droplets of an imprint resist fluid at a plurality of locations onto a substrate. The heater may be configured to maintain a droplet fluid temperature at greater than 23° C., of each of the plurality of droplets prior to being dispensed by the fluid dispenser. Each of the plurality of droplets dispensed by the fluid dispenser may have a fluid volume that is less than 1.2 pL. In an aspect of the first embodiment, the fluid dispenser is configured to have a drop placement accuracy for the imprint resist fluid that is less than a first threshold when the droplet fluid temperature is greater than 23° C. The drop placement accuracy may be greater than the first threshold when the droplet fluid temperature is less than or equal to 23° C.

In an aspect of the first embodiment, the droplet fluid temperature of the dispensed droplets may be between 23.1° C. and 40° C.

In an aspect of the first embodiment, the heater may be a Peltier device which is configured to both heat and cool the imprint resist fluid such that droplet fluid temperature is within a predetermined temperature range. The drop placement accuracy may be less than the first threshold when the droplet fluid temperature is within the predetermined temperature range. The drop placement accuracy is greater than the first threshold when the droplet fluid temperature is outside the predetermined temperature range.

In an aspect of the first embodiment, the fluid volume may be between 0.20 pL and less than 1.2 pL.

In an aspect of the first embodiment, the formation of satellite droplets may be minimized or eliminated relative to when the droplet fluid temperature is less than or equal to 23° C.

In an aspect of the first embodiment, the substrate may be selected from one of: silicon; glass; fused silica; GaAs; GaN; InP; and AlTiC.

In an aspect of the first embodiment, nanoimprint lithography is used to form a pattern from the plurality of droplets.

In an aspect of the first embodiment, may further comprise a cooler for keeping the droplet fluid temperature within a temperature range that is higher than 23.5° C. and less than a temperature at which the imprint resist fluid degrades.

In an aspect of the first embodiment, the fluid volume may be less than 0.75 pL and increasing the droplet fluid temperature improves the drop placement performance as reflected in a relative change in a performance metric.

In an aspect of the first embodiment, the fluid volume may be 0.6 pL or less and the temperature is 25.5° C. or greater.

In an aspect of the first embodiment, may further comprise the imprint resist fluid. Properties of the imprint resist in combination with geometry of the fluid dispenser may cause the drop placement accuracy to be less than the first threshold when the droplet fluid temperature is greater than or equal to 25° C.

In an aspect of the first embodiment, the fluid volume may be 0.6 pL or less.

In an aspect of the first embodiment, the fluid volume may be 0.34 pL or less.

In an aspect of the first embodiment, the fluid dispenser may be configured such that for a given imprint resist fluid behaves in accordance with the following cases. In a first case wherein the fluid volume is a first volume and the droplet fluid temperature is a first temperature, then the drop placement accuracy is a first value. In a second case wherein the fluid volume is the first volume and the droplet fluid temperature is a second temperature greater than the first temperature, then the drop placement accuracy is a second value less than the first value. Wherein a first difference is a subtraction of the second value from the first value. In a third case wherein the fluid volume is a second volume less than the first volume and the droplet fluid temperature is the first temperature, then the drop placement accuracy is a third value. In a fourth case wherein the fluid volume is the second volume and the droplet fluid temperature is the second temperature, then the drop placement accuracy is a fourth value less than the third value. Wherein a second difference is a subtraction of the fourth value from the third value. Wherein the second difference is greater than the first difference.

In an aspect of the first embodiment, the fluid dispenser may be selected from one of: a piezoelectric fluid dispenser, a thermal fluid dispenser, and a microelectromechanical system (MEMS) based fluid dispenser.

A second embodiment is an imprint lithography system comprising: an imprint resist fluid supply; a filtered resist recirculation system and reservoir; a fluid supply line; fluid return line; a fluid dispenser configured to dispense a plurality of droplets of the imprint resist fluid at a plurality of locations onto a substrate; a heater configured to maintain a droplet fluid temperature of each of the plurality of droplets prior to being dispensed by the fluid dispenser is greater than 23° C.; and a temperature control manifold. Each of the plurality of droplets dispensed by the fluid dispenser may have a fluid volume that is less than 1.2 pL. In an aspect of the second embodiment, the fluid dispenser may be configured to have a drop placement accuracy for the imprint resist fluid that is less than a first threshold when the droplet fluid temperature is greater than 23° C. The drop placement accuracy may be greater than the first threshold when the droplet fluid temperature is less than 23° C.

In an aspect of the second embodiment, may further comprise an imprint head for pressing a mold onto the plurality of droplets so as to form a pattern.

A third embodiment is a method of manufacturing an article. The method may comprise: maintaining a droplet fluid temperature greater than 23° C. of each of a plurality of droplets of an imprint resist fluid prior to being dispensed; dispensing the plurality of droplets at a plurality of locations onto a substrate. Each of the plurality of droplets dispensed has a fluid volume that may be less than 1.2 pL. In an aspect of the third embodiment, a drop placement accuracy for the imprint resist fluid may be less than a first threshold when the droplet fluid temperature is greater than 23° C. The drop placement accuracy may be greater than the first threshold when the droplet fluid temperature is less than 23° C.

In an aspect of the third embodiment, the article may be further subjected to known steps and processes for device fabrication.

In an aspect of the third embodiment, the articles may include one or more of: CMOS logic; microprocessors; NAND Flash memory; NOR Flash memory; DRAM memory; MRAM; 3D cross-point memory; Re-RAM; Fe-RAM; STT-RAM; other memory devices; patterned media; field effect transistor devices; heterostructure field effect transistors; light emitting diodes; and read/write heads.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

FIG. 6 is an illustration of an exemplary fluid dispense head and associated image.

FIG. 7 is a table of average droplet diameter of rows illustrated on how the voltage can be adjusted to change the droplet diameter.

FIGS. 8A-B are illustrations of fluid dispense systems incorporating a fluid management system and a temperature controller.

Figure 1:
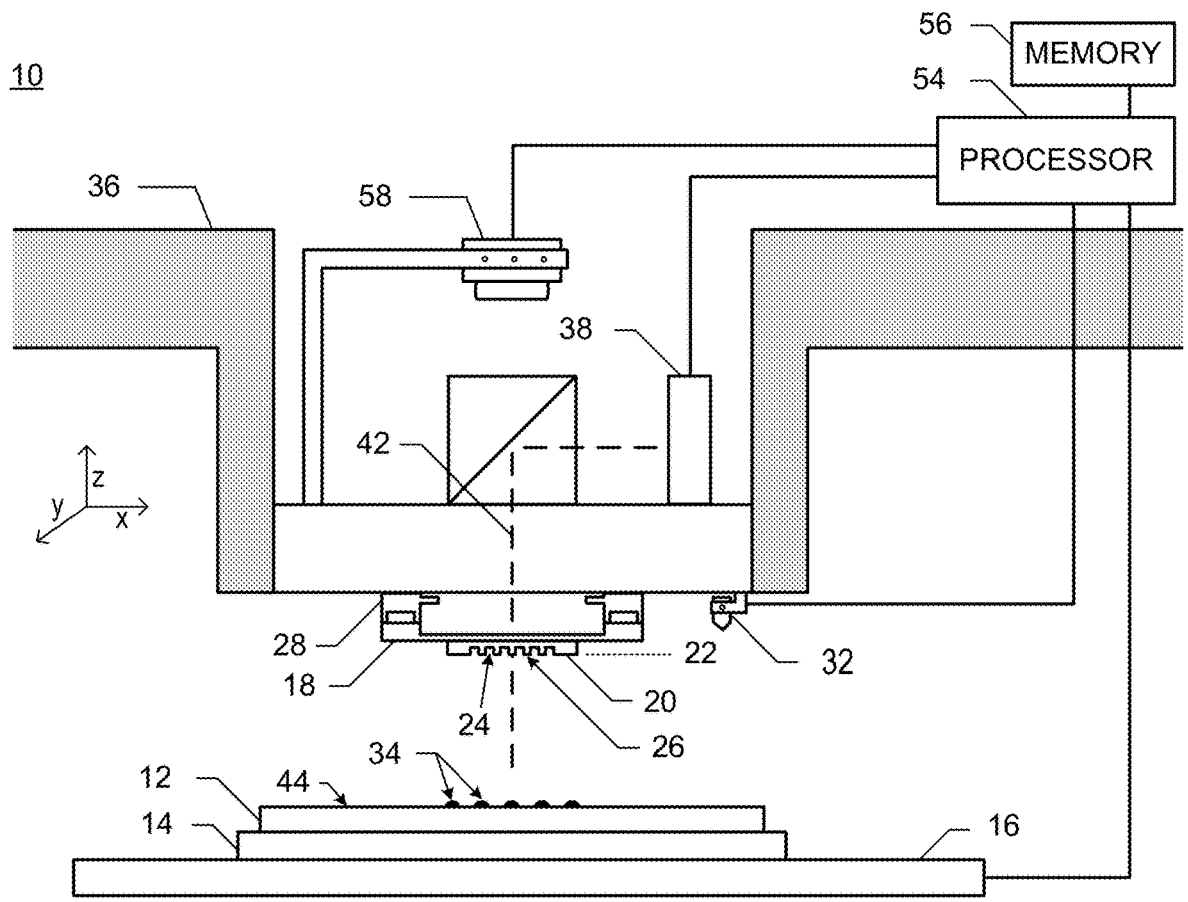
FIG. 1 is an illustration of a nanoimprint lithography system having a template and a mold spaced apart from a substrate.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

What is needed is a system or method for keeping the placement error of droplets below a predetermined threshold while reducing the droplet volume.

FIG. 1 is an illustration of a nanoimprint lithography system 10 in which an embodiment may be implemented. The nanoimprint lithography system 10 is used to form a relief pattern on a substrate 12. Substrate 12 may be coupled to a substrate chuck 14. Substrate chuck 14 may be but is not limited to a vacuum chuck, pin-type, groove-type, electrostatic, electromagnetic, and/or the like.

Substrate 12 and substrate chuck 14 may be further supported by a positioning stage 16. Stage 16 may provide translational and/or rotational motion along one or more of the x, y, x, θ, and φ-axes. Stage 16, substrate 12, and substrate chuck 14 may also be positioned on a base (not shown).

Spaced-apart from the substrate 12 is a template 18. Template 18 may include a body having a first side and a second side with one side having a mesa 20 extending therefrom towards the substrate 12. Mesa 20 may have a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. The patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on the substrate 12.

Template 18 may be coupled to chuck 28. Chuck 28 may be, but not limited to, vacuum, pin-type, groove-type, electrostatic, electromagnetic, and/or other similar chuck types. Further, chuck 28 may be coupled to imprint head which in turn may be moveably coupled to a bridge 36 such that chuck 28, imprint head, and template 18 are moveable in at least the z-axis direction, and potentially other directions.

Nanoimprint lithography system 10 may further comprise a fluid dispensing system 32. Fluid dispensing system 32 may be used to deposit formable material 34 (e.g., polymerizable material) on substrate 12. Additional formable material 34 may also be positioned upon substrate 12 using techniques, such as, drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations. For example, formable material 34 may comprise a monomer mixture as described in U.S. Pat. Nos. 7,157,036 and 8,076,386, both of which are herein incorporated by reference.

The nanoimprint lithography system 10 may further comprise energy source 38 that directs energy along path 42. Imprint head and stage 16 may be configured to position template 18 and substrate 12 in superimposition with path 42. Camera 58 may likewise be positioned in superimposition with path 42. Nanoimprint lithography system 10 may be regulated by processor 54 in communication with stage 16, imprint head, fluid dispensing system 32, source 38, and/or camera 58 and may operate on a computer readable program stored in memory 56.

Figure 2:
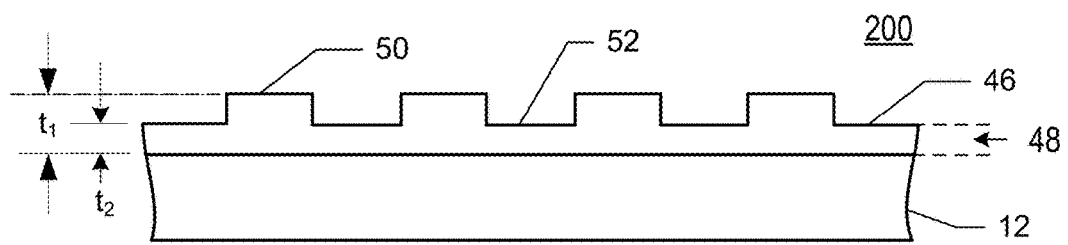
FIG. 2 is an illustration of a substrate with a solidified patterned layer formed upon it.

Either imprint head, stage 16, or both vary a distance between mold 20 and substrate 12 to define a desired volume that is filled by the formable material 34. For example, imprint head may apply a force to template 18 such that mold 20 contacts formable material 34. After the desired volume is filled with formable material 34, source 38 produces energy 40, e.g., ultraviolet radiation, causing formable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$ as illustrated in FIG. 2.

Different fluid dispense systems may use different technologies to dispense liquid materials. In the field of inkjet dispensing, for example, thermal ink jetting, MEMS based ink jetting, and piezoelectric ink jetting are common techniques for dispensing ink.

In the thermal inkjet process, the print cartridges consist of a series of tiny chambers, each containing a heater. To eject a droplet from each chamber, a pulse of current is passed through the heating element causing a rapid vaporization of the ink in the chamber and forming a bubble, which causes a large pressure increase, propelling a droplet of ink onto the paper.

In the piezoelectric inkjet process a piezoelectric material is behind each nozzle instead of a heating element. When a voltage is applied, the piezoelectric material changes shape, generating a pressure pulse in the fluid, which forces a droplet of ink from the nozzle. Piezoelectric (also called Piezo) inkjet devices allow a wider variety of inks than thermal inkjet as there is no requirement for a volatile component, and less issues with residues. The MEMS based ink jetting process is substantially similar to piezoelectric inkjet process except the piezoelectric material is replaced with a MEMS device.

A Piezo-based fluid dispensing system 32 may be used in the dispensing of the formable material 34 for a nanoimprint lithography application. In an alternative embodiment, Piezo-based fluid dispensing system 32 is a MEMS-based fluid dispensing system. The viscosity of fluids typically dispensed with these systems can vary between 5 and 30 centipoise (cP).

Figure 3:
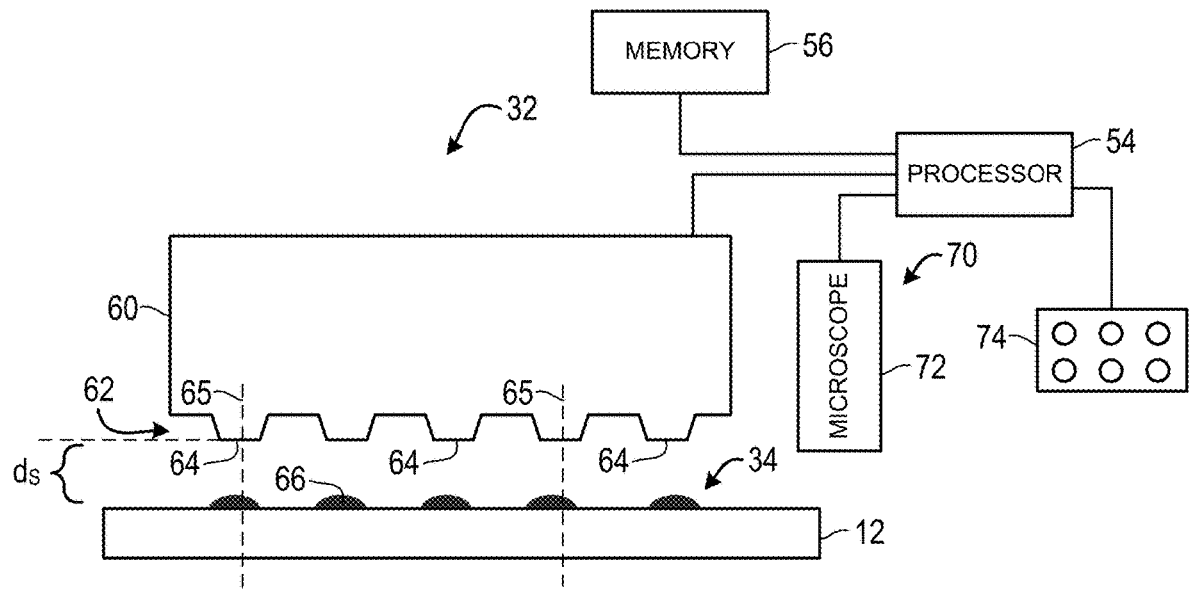
FIG. 3 is an illustration of a fluid dispensing system dispensing fluid onto a substrate.
Figure 4:
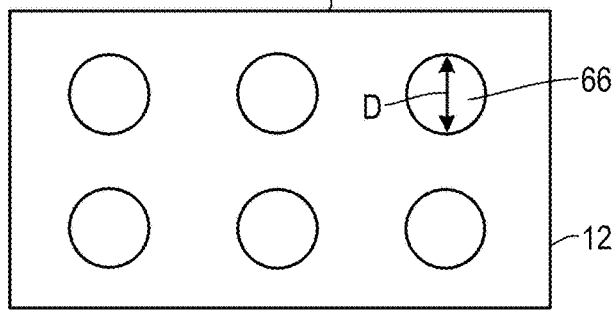
FIG. 4 is an illustration of a portion of image droplets which have been placed onto a substrate.

FIG. 3 is an illustration of the Piezo fluid dispensing system 32 which may further comprise a vision system 70. Vision system 70 may include a microscope 72 (e. g. optical microscope) to provide at least one image 74 of droplets 66 of formable material 34 on substrate 12. Microscope 72 may be controlled by the processor 54, in accordance with the computer-readable program stored in the memory 56. Processor 54 may evaluate image 74 of droplets 66 with a diameter D provided by microscope 72 as illustrated in FIG. 4. Alternatively, evaluation of the image 74 of droplet 66 may be manually provided by a user. Microscope 72 and/or processor 54 may provide feedback to control dispensing of droplets 66 from dispense heads 60 by varying a voltage (or current) applied to dispense heads 60 that includes a plurality of individual nozzles 64. Dispense head 60 may comprise a liquid dispensing actuator able to control the volume $V_D$ of droplets 66 by varying a voltage $V_i$ applied to dispense head 60, and/or to each nozzle 64 of dispense head 60.

Figure 5:
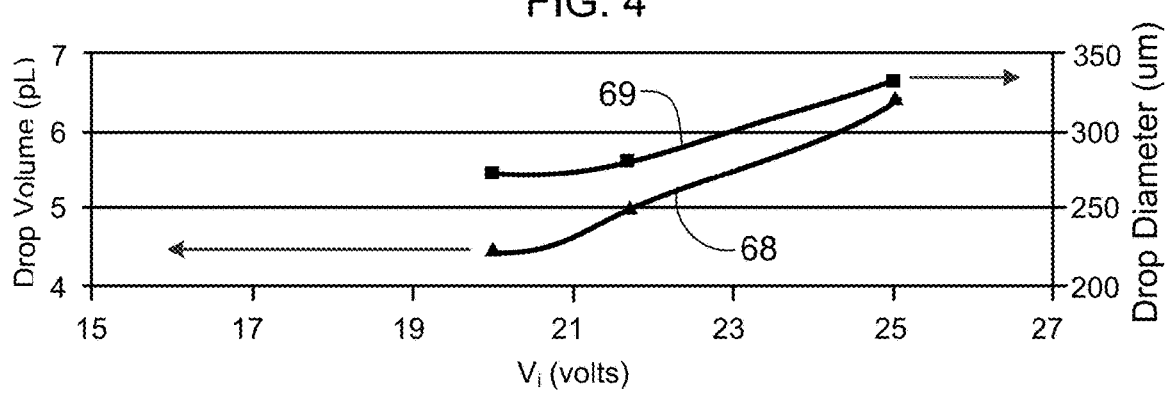
FIG. 5 is an illustration of the relationship between voltage applied to a nozzle, drop volume of a droplet, and drop diameter.

When using fluid dispensing actuators, the magnitude of voltage $V_i$ applied to dispense head 60 may correlate with droplet volume $V_D$ and droplet diameter D for each droplet 66. Further, voltage $V_i$ may directly control droplet volume $V_D$ and droplet diameter D for each droplet 66. As illustrated in the graph of FIG. 5, voltage $V_i$ and droplet volume $V_D$ may be defined by a substantially linear relationship such that an increase in voltage $V_i$ applied to dispense head 60 results in an increase in droplet volume $V_D$ as illustrated by curve 68. Additionally, voltage $V_i$ and droplet diameter D may be defined by a substantially linear relationship such that an increase in voltage $V_i$ applied to dispense head 60 results in an increase in droplet diameter D as illustrated by numeral 69. Based on these relationships, droplet diameter D may be analyzed to provide the voltage $V_i$ resulting in the targeted volume $V_T$ for droplet 66, the targeted volume $V_T$ being the desired volume for droplet 66.

FIG. 6 is an illustration of a fluid dispensing system 32 that includes at least dispense head 60 which includes at least three nozzles 64a, 64b, and 64c. The dispense head may be used to produce a plurality of droplets 66a-i, an image 74 of which is captured by the microscope 72. The processor 54 may analyze image 74 illustrated in FIG. 6 to determine Diameters $D_a$-$D_i$. Wherein each row is associated with an individual nozzle among nozzles 64a-c. Row 1 may be associated with nozzle 64a, row 2 may be associated with nozzle 64b, and row 3 may be associated with nozzle 64c. The processor may analyze the image 74 to produce data such as that illustrated in FIG. 7 which can be used to calibrate voltage $V_i$ applied to dispense head 60 to provide targeted volume $V_T$ for droplets 66. Each dispense head may be calibrated individually for example based on the data in FIG. 7. In an alternative embodiment, the fluid dispense head may include two rows of nozzles. Each row may be driven individually. In one embodiment, the dispense head may be divided up into groups of nozzles along, rows, columns, areas, etc., in which a different waveform and/or voltage is applied to each group of nozzles. In an alternative embodiment, all the nozzles are driven with same voltage and/or waveform.

Having differing drop volumes $V_D$ across the plurality droplets 66 dispensed onto the substrate can result in a variation in the residual layer thickness $t_2$ of the patterned layer 46 and can lead to pattern transfer problems. In an example, a targeted volume $V_T$ for one or more droplets 66 may be assessed. Droplets 66 having volumes $V_D$ may be dispensed based on an initial voltage $V_i$. Droplets 66 may be deposited such that each droplet 66 may spread on substrate 12 while minimizing a probability of contact with another droplet 66. It should be noted that droplets 66 may be deposited on substrate 12 in any pattern desired. The use of the 3×3 grid pattern associated with 3 nozzles illustrated in FIG. 6 is for sake of simplicity of illustration and description. The droplets are then analyzed to determine statistical values such as mean diameter, median diameter, standard deviation, etc. These statistical values may then be used to adjust the initial voltage, such that droplets with a specified diameter are produced.

Figure 8B:
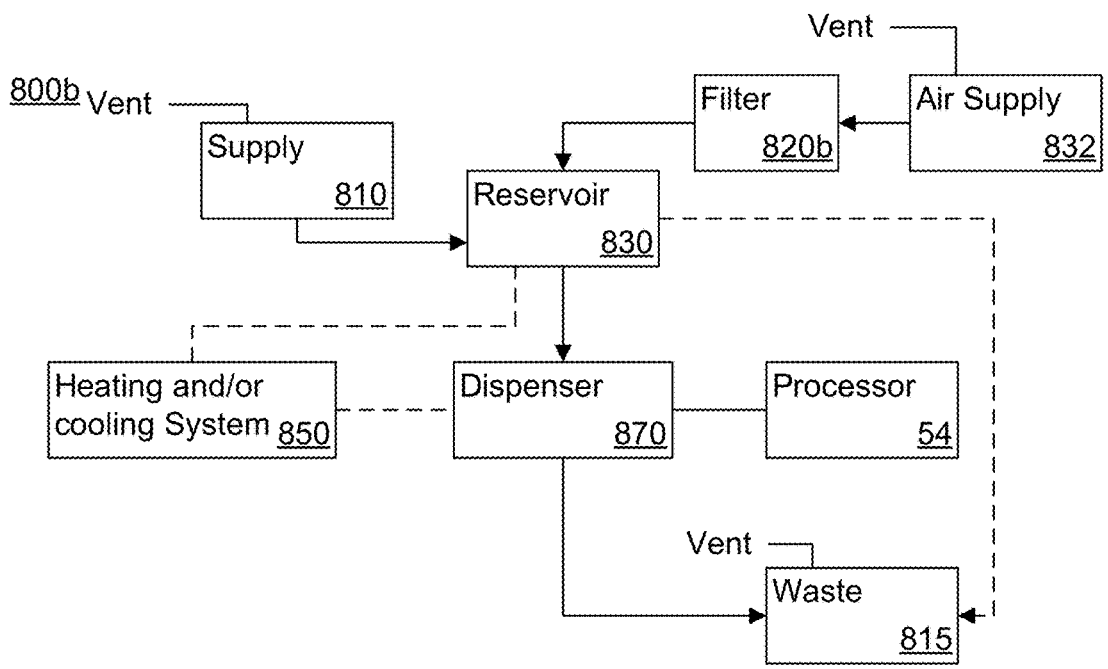

FIG. 8A is an illustration of one embodiment of a fluid dispense system 800 which may be connected to a resist supply 810. The fluid dispense system 800 may include a first pump 805a or may be connected to the first pump 805a that draws the fluid from a reservoir 830. The reservoir may be filled via a resist supply 810 either manually, gravity-fed or via an external pump. The resist supply 810 may include a venting system. The fluid dispense system 800 may include a first filter 820a or may be connected to the first filter 820a which the first pump 805a may pass the resist through. The reservoir 830 may include and/or be connected to a second pump 805b allows the resist to be recirculated and allows the back pressure of the resist at a dispenser 870 to be adjusted. The reservoir 830 may be connected to a waste system 815 through which the resist may be removed from the fluid dispense system 800 either manually, gravity-fed or via an external pump. The waste system 815 may include a venting system. The fluid dispense system 800 may include or be connected to a heating and/or cooling system 850. The first pump 805a may pump the resist through the heating and/or cooling system 850 which adjusts the temperature of the resist. A temperature control manifold 860 may distribute the resist to one or more dispensers 870. The temperature control manifold 860 may be used to control the pressure of the resist as it is distributed to the dispensers 870. In an embodiment, all of the dispensers 870 and/or nozzles of the dispensers 870 receive resist that is at the same resist temperature. The dispenser 870 will dispense the resist as needed. Any resist that has not been dispensed may be sent back to the reservoir 830 via a return line which may pass through the temperature control manifold 860. The temperature control manifold 860 may be used to monitor the resist fluid temperature as it approaches the inkjet dispense head 870 and provide feedback to the heating and/or cooling system 850. An alternative embodiment is a gravity fed fluid dispense system 800b illustrated in FIG. 8B. The vented supply tank 810 may be located above a reservoir 830 and connected via a valve controlled supply line. The reservoir 830 may be located above the dispenser 870 and the supply of resist to the dispenser 870 may controlled via an additional valve controlled supply line. The reservoir 870 may also be pressurized with filtered air via a gas filter 820b and an air supply 832. The heating and/or control system may use control the temperature of one or more of: the reservoir 830; the dispenser 870; environment of the dispenser 870; resist in the reservoir 830; and the resist in the dispenser 870. A vented waste tank may be connected to one or both of the reservoir 830 and the dispenser 870.

In an embodiment, the heating and/or cooling system 850 is a Peltier device that is used to set the temperature of the resist fluid. The Peltier device may also be referred to as a Peltier heat pump, solid state refrigerator, or thermoelectric cooler (TEC). The Peltier device is a solid-state active heat pump which transfers heat from one side of the device to another side of the device. The Peltier device can be configured to be used for both heating and cooling, and when combined with the temperature control manifold 860 and a feedback loop, can also be used as a temperature controller that both heats and cools keeping the resist within a temperature range. In an alternative embodiment, the heating and/or cooling system 850 may include one or more of a water chillers, vapor compression chillers, heat exchangers, resistive heaters, temperature controller, and the like.

Figure 9:
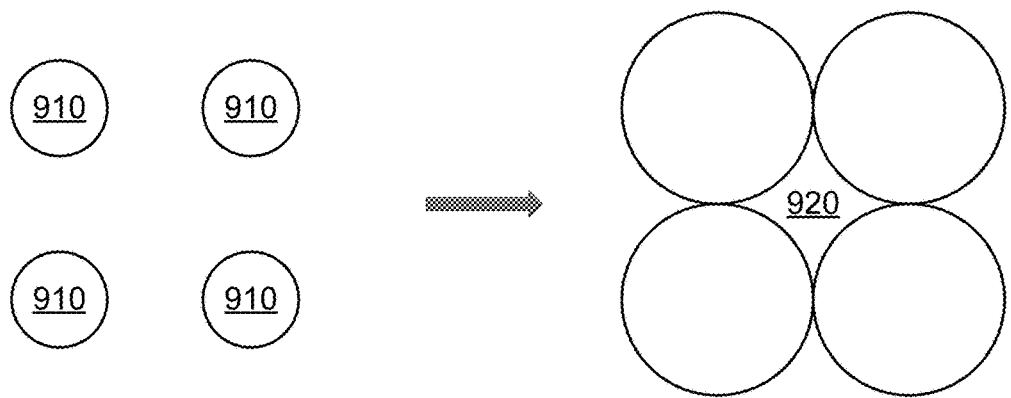
FIG. 9 is an illustration of droplets merging.

The drop volume $V_D$ plays a role in improving the throughput that can be obtained with a nanoimprint system. Throughput may be limited by the time it takes to fill the plurality of spaced-apart recesses 24 and/or protrusions 26 on the patterning surface 22 of template 18. The fill time may be comprised of two main components: the time it takes for drops to coalesce; and the time it takes for the trapped gas volume formed between coalesced drops to dissipate. Referring to FIG. 9, for a given targeted residual layer thickness $t_2$, a specific volume of formable material must be applied from the Piezo dispense system 800. If a small drop volume $V_D$ 910 is used, as shown in FIG. 9, as the template 20 makes contact with the surface 44 of the substrate, the drops will spread laterally, and reach a point where the drops begin to coalesce, leaving a small volume of trapped gas $V_{TG}$ 920 between the drops. In the case where a larger drop volume $V_D$ is used then a larger volume of gas $V_{TG}$ is entrapped the corresponding area between droplets. The trapped gas must dissipate, however, if all of the spaced apart recesses 24 and/or protrusions 26 are to fill with the formable material 34. The larger the amount of trapped gas, the longer it will take to fill all recesses 24 and/or protrusions 26. As a result, it is advantageous to be able to work with drop volumes as small as possible.

Figure 10:
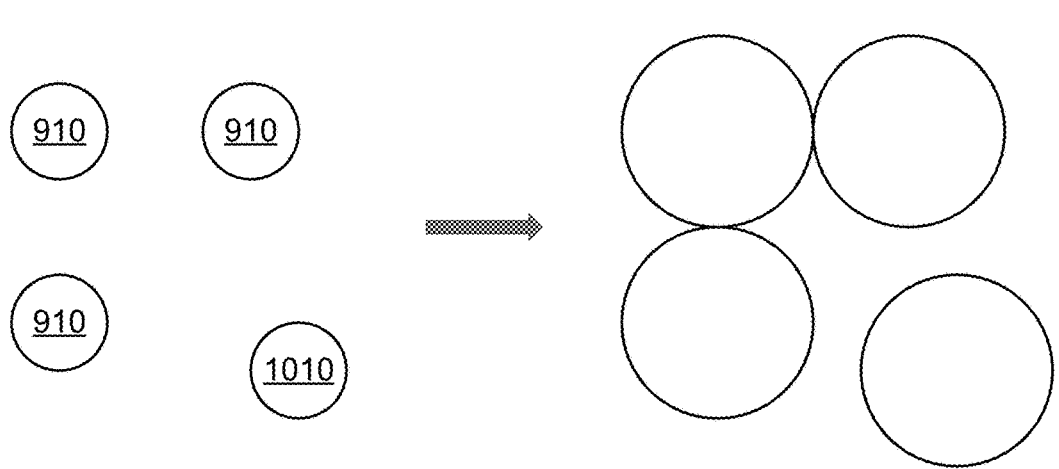
FIG. 10 is an illustration of droplets merging when one droplet is offset relative to the other droplets.

Similarly, the placement of drops on a substrate has a significant effect on fill time. Even if drop volumes are small, a significant offset, as illustrated in FIG. 10, in the placement of a drop can impact throughput and defectivity. Defectivity, as it relates to drop placement is defined as areas in which the spaced apart recesses 24 and/or protrusions 26 are not filled by the formable material 34. This defect mode is often referred to as a non-fill defect. Referring to the simple example in FIG. 10, offsetting one droplet 1010 with volume $V_D$ leads to a condition in which three of the four drops have coalesced, but the remaining drop has not. Therefore, the drops must continue to increase in diameter before all drops coalesce. If the drops never coalesce, then a non-fill defect may occur.

It is important, therefore that both drop volume $V_D$ be minimized and drop placement be optimized in order to reduce drop fill time and thereby improve the throughput of a nanoimprint system. Increasing the drop velocity from the printhead to the print substrate can improve the drop placement. However, when the drop velocity is increased past a certain breakup threshold velocity the drop filament may break up before a single drop is formed. This breakup may generate mist and/or satellites. For a given fluid there may be a threshold breakup velocity that is dependent on fluid properties, nozzle geometry, and drop size. For a given fluid and nozzle geometry, increasing temperature can create a higher threshold velocity for drops below 1 pL thus providing improved drop placement.

Drop volumes in typical Piezo fluid dispense systems are optimized to work in a range of 4-32 pL. The applicants have found that this is not an optimal volume for achieving high throughput in a nanoimprint system. Instead, drop volumes on the order of 2 pL and lower are targeted. In this volume regime, although reduced drop volumes can be achieved, control of drop volume, including both the integrity of the formed droplet and the placement of the formed droplet is not well understood.

One method for reducing the drop volume $V_D$ is to change the voltage and/or voltage waveform applied to the Piezo fluid dispense system. This has enabled the formation of droplets as small as 0.30 pL at room temperature (~23° C.). The room temperature setting is typically done to be consistent with the ambient temperature. However the reduction in drop volume at room temperature setting creates additional issues that can impact residual layer thickness uniformity, feature fill time, throughput and defectivity.

Figure 11A:
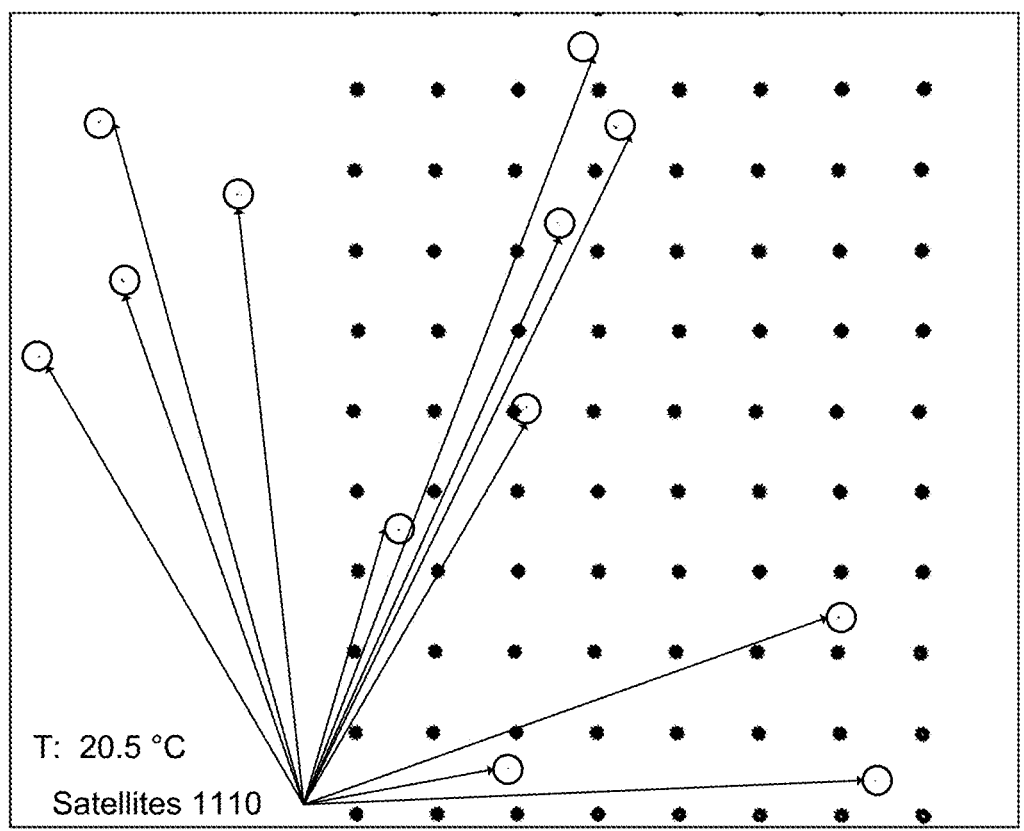
FIGS. 11A and 11B illustrate the formation of satellite droplets formed when dispensing at 20.5° C., and the elimination of satellite droplets when the dispense temperature is increased to 25.5° C.
Figure 11B:
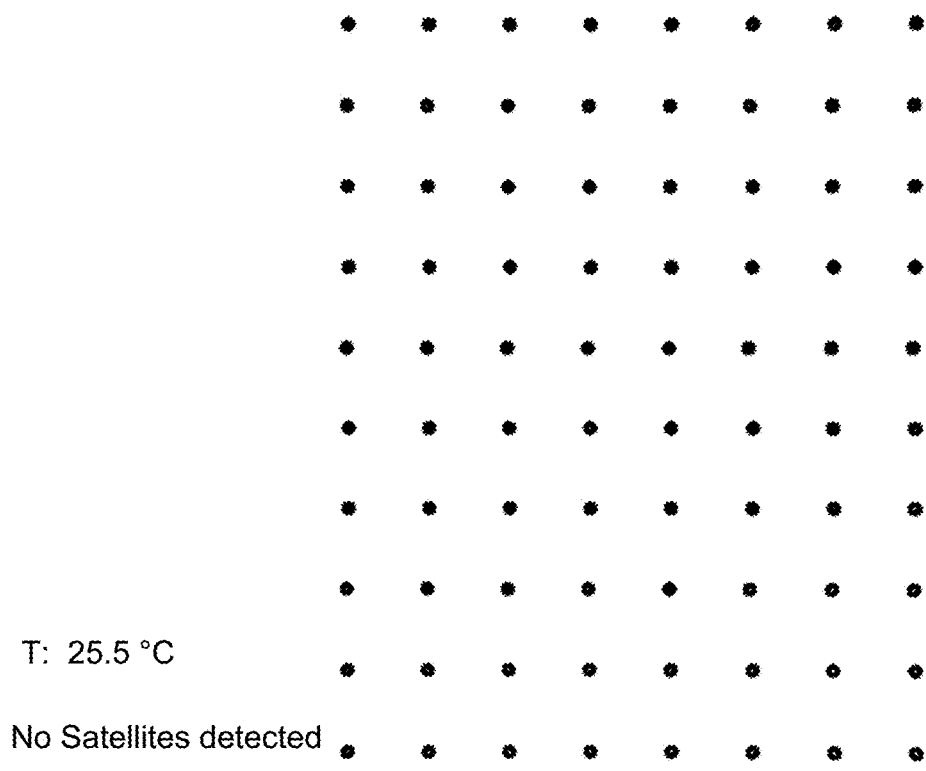

In some cases, the droplets formed can produce satellite droplets or mist, as illustrated in FIG. 11A. FIG. 11A is an analysis of a photograph of droplets which were deposited in a regular array, the droplet temperature was 20.5° C. and the drop volume $V_D$ was 0.53 pL. However, it is also apparent that numerous satellite droplets 1110 were deposited off the intended grid. These satellite droplets 1110 reduce the drop volume of droplets while also adding additional material in unwanted areas. This has an impact on the filling time and residual layer thickness uniformity. FIG. 11B is a photograph of a similar droplet array in which the droplet temperature was raised to 25.5° C. and in which no significant satellite droplets were detected.

In addition, the deposition of droplets at lower temperatures contributes to issues associated with droplet placement. The applicants have found that the smaller the droplet, the larger the drop placement error. These drop placement errors impact resist fill time and throughput.

Figure 12A:
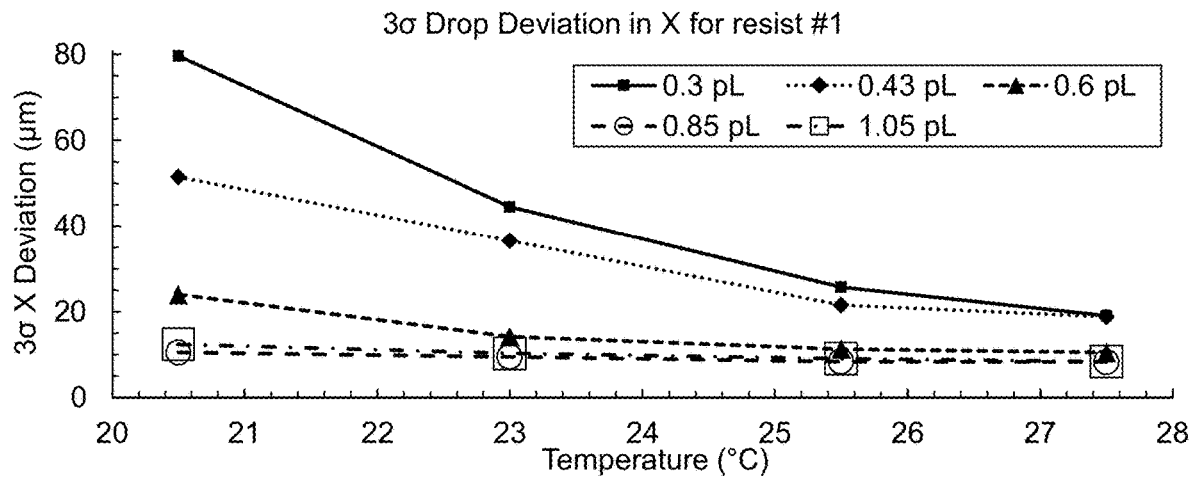
FIGS. 12A-D describe the deviation of droplet placement in the x direction as a function of drop volume, temperature for three different resists.
Figure 12B:
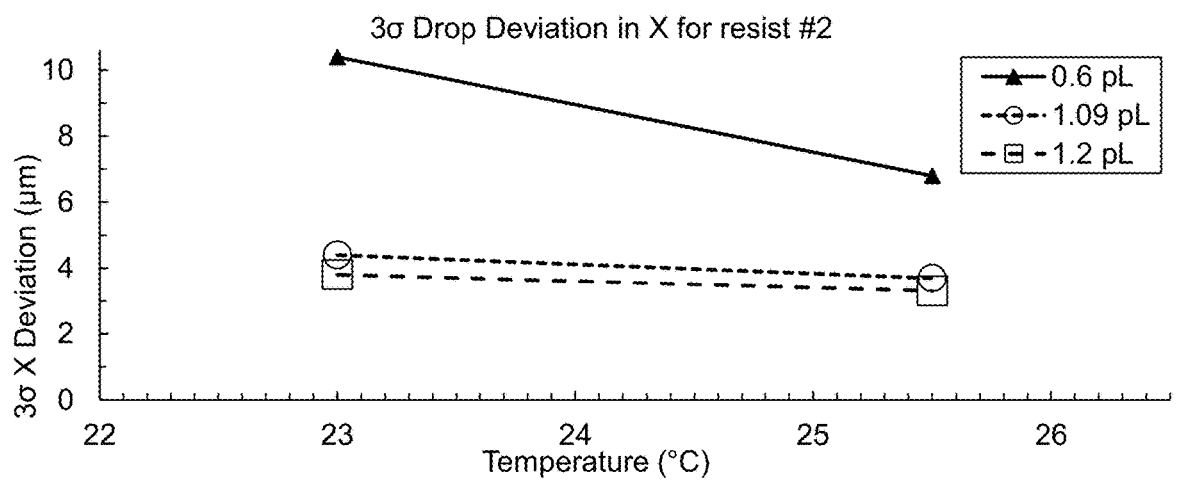
Figure 12C:
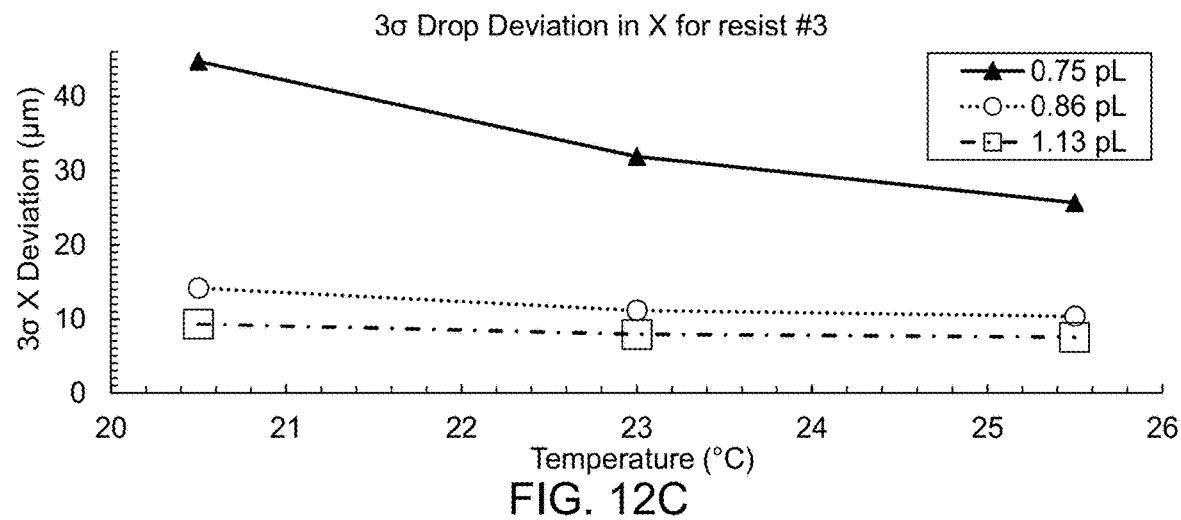
Figure 12D:
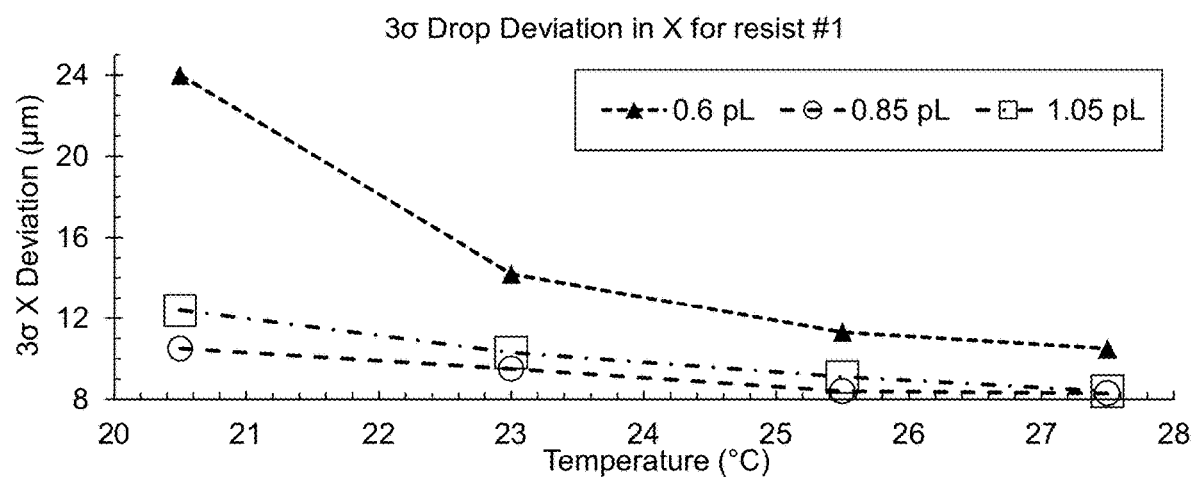

FIGS. 12A-D are graphs showing experimental data based on analysis of photos similar to those illustrated in FIGS. 11A-B of the effect of temperature and drop volume on placement accuracy in the x direction (the direction in which the dispenser is being moved while dispensing) for three different resists. Tables 1-3 below illustrate the effect of temperature and drop volume on a drop placement performance metric such as 3σ deviation in both the x and y direction for three different resists. Drop volumes included 1.05 pL, 0.85 pL, 0.6 pL, 0.43 pL, and 0.34 pL for a first resist at 20.5° C., 23° C., 25.5° C., and 27.5° C. as illustrated in FIGS. 12A and 12D. FIG. 12D emphasizes the distinction between 0.6 pL drops and larger drops for the first resists at 20.5° C., 23° C., 25.5° C., and 27.5° C. Notice how for larger droplets there is very little variation with temperature but for sub-pL drops this variation increases. Drop volumes included 1.2 pL, 1.09 pL, and 0.6 pL for a second resist at 23° C. and 25.5° C. as illustrated in FIG. 12B. Drop volumes included 1.13 pL, 0.86 pL, and 0.75 pL for a third resist at 20.5° C., 23° C., and 25.5° C. as illustrated in FIG. 12C. The drop volume can be adjusted by adjusting the voltage and/or waveform applied to the liquid dispensing system. Commercially available liquid dispensing systems have operating values of 1-32 pL for resists as used in nanoimprint lithography. FIGS. 12A-D detail the 3σ deviation in drop placement in the x-direction for different drop volumes at different temperatures for different resists. The applicants have found that at room temperature reducing the drop volume has significant impact on the drop placement performance especially in the scanning direction (x-direction). Drop placement performance may be reflected in many metrics. One metric which reflects the drop placement performance is the 3σ deviation drop placement in the scanning direction while jetting. Another metrics which reflect the drop placement performance include the 3σ deviation in the sub-scanning direction and a satellite ratio which is a ratio between the number (or volume) of satellite droplets produced and intentionally deposited droplets. The 3σ deviation is a quantitative statistical measure of the accuracy of the drop placement performance.

TABLE 1

Resist #1

| Drop Vol (pL) | Temp (° C.) | 3σ Deviation (μm) | |
|---|---|---|---|
| | | X-dev | Y-dev |
| 0.3 | 20.5 | 79.7 | 11 |
| | 23 | 44.5 | 8.6 |
| | 25.5 | 25.7 | 5.7 |
| | 27.5 | 19.1 | 6.4 |
| 0.43 | 20.5 | 51.5 | 7.3 |
| | 23 | 36.6 | 7.4 |
| | 25.5 | 21.5 | 5.5 |
| | 27.5 | 18.8 | 7.1 |
| 0.6 | 20.5 | 24 | 6 |
| | 23 | 14.2 | 7.7 |
| | 25.5 | 11.3 | 4.9 |
| | 27.5 | 10.5 | 7 |
| 0.85 | 20.5 | 10.5 | 6.7 |
| | 23 | 9.5 | 4.6 |
| | 25.5 | 8.4 | 4.1 |
| | 27.5 | 8.3 | 5.6 |
| 1.05 | 20.5 | 12.4 | 6.3 |
| | 23 | 10.3 | 6.6 |
| | 25.5 | 9.1 | 4.2 |
| | 27.5 | 8.4 | 4.4 |

TABLE 2

Resist #2

| Drop Vol (pL) | Temp (° C.) | 3σ Deviation (μm) | |
|---|---|---|---|
| | | X-dev | Y-dev |
| 0.6 | 23 | 10.4 | 2.2 |
| | 25.5 | 6.8 | 3.1 |
| 1.09 | 23 | 4.4 | 2.4 |
| | 25.5 | 3.7 | 2.7 |
| 1.2 | 23 | 3.8 | 2.5 |
| | 25.5 | 3.3 | 1.8 |

TABLE 3

Resist #3

| Drop Vol (pL) | Temp (° C.) | 3σ Deviation (μm) | |
|---|---|---|---|
| | | X-dev | Y-dev |
| 0.75 | 20.5 | 44.7 | 2.8 |
| | 23 | 31.9 | 2.7 |
| | 25.5 | 25.7 | 2.9 |
| 0.86 | 20.5 | 14.2 | 2.6 |
| | 23 | 11.2 | 2.5 |
| | 25.5 | 10.4 | 2.6 |
| 1.13 | 20.5 | 9.3 | 2.6 |
| | 23 | 7.9 | 2.8 |
| | 25.5 | 7.5 | 3.1 |

The applicants have determined that raising the temperature by a small amount has a larger than expected impact on the drop placement performance when the drop volume is reduced to below 1.0 pL while also reducing satellite formation. The applicants have determined that raising the temperature by a small amount has an even larger impact on the drop placement performance when the drop volume is reduced well below 1.0 pL to 0.3 pL and 0.43 pL while also reducing satellite formation. This is in contrast to prior art methods, which have relied upon increasing the temperature of the ink to increase the size of the ink droplets. In the prior art, a lower temperature would have been used to decrease the size of the droplets, while the applicants have found that for smaller droplets, it is helpful to increase the temperature.

Further improvements in drop placement are possible by continuing to increase the temperature beyond 27.5° C. An increase in temperature is limited by the potential onset of polymerization of the resist which can occur above 40° C. Different resist formulation have different temperatures at which polymerization occurs and thus have different limits on the temperature at which the resist is kept at. Furthermore, the piezo dispense system must be made of a material which can operate for extended periods of time at an elevated temperature.

One embodiment, may include a resist temperature control system that is external to the piezo fluid dispensing system. The resist may be heated prior to being sent to the piezo fluid dispensing system. The supply line which provides the heated resist may be jacketed so as to prevent a significant amount of heat from being transmitted into the lithography system. In addition, the resist may be heated for a limited period of time to prevent degradation. A reservoir of heated resist may also be jacketed and have a limited volume to prevent heat transmission. The return line may also be jacketed. These provisions for heat are used to mitigate thermal effects of the heated resist onto parts of the lithography system such as exposure optics and alignment systems.

An alternative embodiment, may include a system that controls the temperature of the resist in the dispensing system. A further alternative embodiment, may include adjusting the temperature of both the dispensing system and the resist. The increase in temperature above 23° C., may be as low as 23.1° C. and as high as 40° C., with a more typical temperature operating range of 24° C. to 30° C. Drop volumes may range from 0.10 pL to 1.2 pL, with a more typical drop volume range of 0.30 pL to 1.0 pL.

Piezo fluid dispensing system 32 may further be coupled to a Nanoimprint lithography system 10. The fluid dispensing system 32 may be used to deposit formable material 34 onto the substrate 12.

The nanoimprint lithography system 10 along with the Piezo fluid dispensing system 32 can be used to fabricate devices on a substrate such as: CMOS logic; microprocessors; NAND Flash memory; NOR Flash memory; DRAM memory; MRAM; 3D cross-point memory; Re-RAM; Fe-RAM; STT-RAM; optoelectronics and other devices in which nanoimprint lithography is used as part of the fabrication process.

Other substrates materials can but is not include but is not limited to: glass, fused silica, GaAs, GaN, InP, Sapphire, AlTiC, and other substrates well known in the art. Devices, fabricated on these substrates include patterned media, field effect transistor devices, heterostructure field effect transistors, light emitting diodes, read/write heads, and the like.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method comprising:
   dispensing a plurality of droplets of a fluid at a plurality of locations onto a substrate with a piezoelectric fluid dispenser having a plurality of nozzles; wherein a fluid volume of one or more of the plurality of droplets is less than 1.2 pL; wherein, for droplets that have the fluid volume that is less than 1.2 pL, the fluid dispenser has an experimentally measured drop placement accuracy of the plurality of droplets on the substrate, that:
   varies with a fluid temperature of the fluid being recirculated through the fluid dispenser;
   is less than a first threshold while the fluid temperature of the fluid recirculated through the dispenser is greater than 23° C.; and
   is greater than the first threshold while the fluid temperature of the fluid recirculated through the dispenser is less than or equal to 20.5° C.; and
   wherein the drop placement accuracy is a statistical metric of deviation in placement of the plurality of drops dispensed by all of the plurality of nozzles of the fluid dispenser as measured by photographs of the plurality of drops on a test substrate;
   maintaining the fluid recirculating through the dispenser at the fluid temperature of greater than 23° C., prior to the fluid being recirculated through the fluid dispenser and dispensed by the fluid dispenser as the plurality of droplets.

2. The method of claim 1, wherein the fluid recirculating through the dispenser is maintained at the fluid temperature between 23.1° C. and 40° C., prior to the fluid being recirculated through the fluid dispenser and dispensed by the fluid dispenser as the plurality of droplets.

3. The method of claim 1, wherein the fluid recirculating through the dispenser is maintained at the fluid temperature with a Peltier device which is configured to both heat and cool the fluid such that droplet fluid temperature is within a predetermined temperature range;
   wherein, the experimentally measured drop placement accuracy is less than the first threshold when the fluid temperature is within the predetermined temperature range; and
   wherein, the experimentally measured drop placement accuracy is greater than the first threshold when the droplet fluid temperature is outside the predetermined temperature range.

4. The method of claim 1, wherein the fluid volume is between 0.20 pL and less than 1.2 pL.

5. The method of claim 1, wherein maintaining the fluid temperature further comprises using a cooler for keeping the fluid temperature within a temperature range that is higher than 23.0° C. and less than a temperature at which the fluid degrades.

6. The method of claim 1, wherein the fluid volume is 0.6 pL or less and the fluid temperature is 25.5° C. or greater.

7. The method of claim 1, wherein the fluid is an imprint resist fluid,
   wherein properties of the imprint resist fluid in combination with geometry of the fluid dispenser cause the experimentally measured drop placement accuracy to be less than a first threshold when the droplet fluid temperature is greater than or equal to 25° C.

8. The method of claim 1, wherein the fluid volume is 0.6 pL or less.

9. The method of claim 1, wherein the fluid volume is 0.34 pL or less.

10. The method of claim 1, wherein the fluid dispenser is configured such that for a given fluid:
    in a first case wherein the fluid volume is a first volume and the droplet fluid temperature is a first temperature, then a drop placement accuracy is a first value;
    in a second case wherein the fluid volume is the first volume and the droplet fluid temperature is a second temperature greater than the first temperature, then the drop placement accuracy is a second value less than the first value;
    wherein a first difference is a subtraction of the second value from the first value;
    in a third case wherein the fluid volume is a second volume less than the first volume and the droplet fluid temperature is the first temperature, then the drop placement accuracy is a third value;
    in a fourth case wherein the fluid volume is the second volume and the droplet fluid temperature is the second temperature, then the drop placement accuracy is a fourth value less than the third value;
    wherein a second difference is a subtraction of the fourth value from the third value;
    wherein the second difference is greater than the first difference.

11. The method of claim 1, further comprising:
    recirculating the fluid between:
    a reservoir;
    one or more filters;
    the fluid dispenser; and
    a temperature manifold for maintaining the fluid recirculating through the dispenser at the fluid temperature.

12. The method of claim 1, used for manufacturing an article, further comprising:
    imprinting the plurality of droplets of the fluid with a patterning surface of a template, wherein the patterning surface is one of: a planar surface and a surface with features;
    solidifying the fluid underneath the template;
    subjecting the article to known steps and processes for device fabrication.

13. The method of claim 1, wherein the experimentally measured drop placement accuracy is in a scanning direction.

14. The method of claim 1, wherein
    the experimentally measured drop placement accuracy is a $3\sigma$ deviation in drop placement of the plurality of drops dispensed by all of the plurality of nozzles of the fluid dispenser.

15. The method of claim 1, further comprising measuring the experimentally measured drop placement accuracy at a plurality of fluid temperatures that are recirculated through the piezoelectric fluid dispenser.

16. A fluid dispensing method comprising:
    storing a fluid that is a formable material in a reservoir, the formable material containing a monomer mixture;
    dispensing, with a piezoelectric fluid dispenser having a plurality of nozzles, a plurality of droplets of the fluid from the reservoir at a plurality of locations onto a substrate with an experimentally measured drop placement accuracy for the plurality of droplets on the substrate that have a fluid volume that is less than 1.2 pL, and the drop placement accuracy varies with the fluid temperature of the fluid being recirculated through the fluid dispenser; and
    wherein the drop placement accuracy is a statistical metric of deviation in placement of the plurality of drops dispensed by all of the plurality of nozzles of the fluid dispenser as measured by photographs of the plurality of drops on a test substrate;

maintaining, with a temperature control system, a fluid temperature of the fluid at greater than 23° C., prior to being recirculated through the fluid dispenser and dispensed by the fluid dispenser as the plurality of droplets;

wherein the fluid dispenser, for droplets that have the fluid volume that is less than 1.2 pL, has an experimentally drop placement accuracy metric for the fluid that is less than a first threshold while the temperature control system controls the fluid temperature to be greater than 23° C.;

wherein the fluid dispenser is experimentally for droplets that have the fluid volume that is less than 1.2 pL, to have the experimentally measured drop placement accuracy metric that is greater than the first threshold while the temperature control system controls the fluid temperature to be less than or equal to 20.5° C.; and causing, with a controller, a voltage waveform to be applied to the piezoelectric fluid dispenser such that the fluid droplet volume is less than 1.2 pL while the temperature control system maintains the fluid temperature of the fluid recirculating through the piezoelectric fluid dispenser at greater than 23° C., wherein the drop placement accuracy metric of the piezoelectric fluid dispenser is less than the first threshold when the fluid temperature is greater than 23° C., and the drop placement accuracy metric of the piezoelectric fluid dispenser is greater than the first threshold when the fluid temperature is less than 20.5° C.

17. An imprint lithography method comprising:

containing, within a reservoir, a fluid that is a formable material, the formable material containing a monomer mixture;

filtering the fluid;

recirculating the fluid;

dispensing, with a piezoelectric fluid dispenser having a plurality of nozzles, a plurality of droplets of the fluid from the reservoir at a plurality of locations onto a substrate with an experimentally measured drop placement accuracy for of the plurality of droplets on the substrate that have a fluid volume that is less than 1.2 pL, and the drop placement accuracy varies with the fluid temperature of the fluid being recirculated through the fluid dispenser;

wherein the drop placement accuracy is a statistical metric of deviation in placement of the plurality of drops dispensed by all of the plurality of nozzles of the fluid dispenser as measured by photographs of the plurality of drops on a test substrate;

maintaining, with a temperature control system, a fluid temperature of the fluid prior to being recirculated through the piezoelectric fluid dispenser and dispensed by the piezoelectric fluid dispenser, at greater than 23° C.; and wherein the fluid dispenser has an experimentally measured drop placement accuracy metric for the fluid that is less than a first threshold when while the temperature control system controls the fluid temperature to be greater than 23° C.;

wherein the fluid dispenser has the experimentally measured drop placement accuracy metric that is greater than the first threshold while the temperature control system controls the fluid temperature to be less than or equal to 20.5° C.; and causing, with a controller, a voltage waveform to be applied to the piezoelectric fluid dispenser such that the fluid droplet volume is less than 1.2 pL while the temperature control system maintains the fluid temperature of the fluid recirculating through the piezoelectric fluid dispenser at greater than 23° C., wherein the drop placement accuracy metric of the piezoelectric fluid dispenser is less than the first threshold when the fluid temperature is greater than 23° C., and the drop placement accuracy metric of the piezoelectric fluid dispenser is greater than the first threshold when the fluid temperature is less than 20.5° C.; and wherein, each of the plurality of droplets dispensed by the fluid dispenser has a fluid volume that is less than 1.2 pL.

* * * * *